(12) United States Patent
Triyoso et al.

(10) Patent No.: US 12,588,434 B2
(45) Date of Patent: Mar. 24, 2026

(54) METHODS FOR FORMING DIELECTRIC MATERIALS WITH SELECTED POLARIZATION FOR SEMICONDUCTOR DEVICES

(71) Applicant: Tokyo Electron Limited, Tokyo (JP)

(72) Inventors: Dina H. Triyoso, Albany, NY (US); Robert D. Clark, Fremont, CA (US); Steven P. Consiglio, Albany, NY (US); Kandabara N. Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/390,399

(22) Filed: Jul. 30, 2021

(65) Prior Publication Data

US 2022/0044922 A1      Feb. 10, 2022

Related U.S. Application Data

(60) Provisional application No. 63/063,840, filed on Aug. 10, 2020.

(51) Int. Cl.
| | |
|---|---|
| *H10P 14/60* | (2026.01) |
| *H10P 14/692* | (2026.01) |

(52) U.S. Cl.
CPC ........ *H10P 14/6339* (2026.01); *H10P 14/662* (2026.01); *H10P 14/69392* (2026.01); *H10P 14/69395* (2026.01)

(58) Field of Classification Search
CPC ........... H01L 21/0228; H01L 21/02181; H01L 21/02189; H01L 21/022
See application file for complete search history.

(56) References Cited

U.S. PATENT DOCUMENTS

| | | | |
|---|---|---|---|
| 6,441,417 B1 | 8/2002 | Zhang | |
| 7,709,359 B2 | 5/2010 | Boescke et al. | |
| 8,304,823 B2 | 11/2012 | Boescke | |
| 9,147,689 B1 | 9/2015 | Chavan et al. | |
| 2001/0054388 A1* | 12/2001 | Qian | C23C 16/56 427/539 |
| 2008/0251836 A1 | 10/2008 | Park | |
| 2012/0025326 A1 | 2/2012 | Nakagawa | |
| 2015/0214322 A1 | 7/2015 | Mueller et al. | |

(Continued)

FOREIGN PATENT DOCUMENTS

| | | |
|---|---|---|
| JP | 2003023140 A | 1/2003 |
| JP | 2010283040 A | 12/2010 |

(Continued)

OTHER PUBLICATIONS

Korean Intellectual Property Office, The International Search Report and Written Opinion for International Application No. PCT/US2021/043952, mailed Nov. 17, 2021, 8 pages.

(Continued)

*Primary Examiner* — Lex H Malsawma
*Assistant Examiner* — Sean Ayers Winters

(57) ABSTRACT

Dielectric films for semiconductor devices and methods of forming. A processing method includes forming a first film of a first dielectric material on a substrate by performing a first plurality of cycles of atomic layer deposition and, thereafter, heat-treating the first film, where a thickness of the first film is below a threshold thickness needed for spontaneous polarization in the first dielectric material. The processing method further includes forming a second film of a second dielectric material on the substrate by performing a second plurality of cycles of atomic layer deposition and, thereafter, heat-treating the second film, where a thickness of the second film is greater than the thickness of the first film, and the second film is ferroelectric or antiferroelectric. The first and second dielectric materials can include at least one metal oxide, for example zirconium oxide, hafnium oxide, or a laminate or mixture thereof.

10 Claims, 5 Drawing Sheets

(56)　　　　　References Cited

U.S. PATENT DOCUMENTS

| | | | |
|---|---|---|---|
| 2016/0181091 A1 | 6/2016 | Niyogi et al. | |
| 2016/0308021 A1 | 10/2016 | Lee | |
| 2017/0103988 A1 | 4/2017 | Nishida et al. | |
| 2017/0365719 A1 | 12/2017 | Chen et al. | |
| 2018/0175185 A1 | 6/2018 | Chang | |
| 2019/0131420 A1* | 5/2019 | Lu | H01L 29/40111 |
| 2019/0252489 A1* | 8/2019 | Lu | H01L 29/6684 |
| 2019/0304988 A1 | 10/2019 | Dong et al. | |
| 2020/0006547 A1* | 1/2020 | Hsu | H01L 29/7848 |
| 2020/0136027 A1 | 4/2020 | Wu et al. | |
| 2020/0203499 A1 | 6/2020 | Chang et al. | |
| 2021/0140049 A1* | 5/2021 | Han | H10B 53/00 |

FOREIGN PATENT DOCUMENTS

| | | | |
|---|---|---|---|
| JP | 2018098478 A | 6/2018 |
| TW | 200843042 A | 11/2008 |
| TW | 202018871 A | 5/2020 |

OTHER PUBLICATIONS

Mikolajick, et al. "The Past, the Present, and the Future of Ferroelectric Memories." IEEE Transactions on Electron Devices, vol. 67, No. 4, 2020, pp. 1434-1443., https://doi.org/10.1109/ted.2020.2976148.

Park, et al. "Ferroelectricity and Antiferroelectricity of Doped Thin HFO2-Based Films." Advanced Materials, vol. 27, No. 11, 2015, pp. 1811-1831, https://doi.org/10.1002/adma.201404531.

Taiwanese Office Action mailed on Dec. 17, 2024, issued in Taiwanese Patent Application No. TW110129234, with English Translation, total 8 pgs.

Office Action issued Mar. 11, 2025 in Japanese Patent Application No. 2023-509574, with English translation, 5 pages.

Office Action issued May 30, 2025 in Korean Patent Application No. 10-2023-7002323, with English translation, 6 pages.

* cited by examiner

60

61

METHODS FOR FORMING DIELECTRIC MATERIALS WITH SELECTED POLARIZATION FOR SEMICONDUCTOR DEVICES

This application is related to and claims priority to U.S. Provisional Patent Application Ser. No. 63/063,840 filed on Aug. 10, 2020, the entire contents of which are herein incorporated by reference.

FIELD OF THE INVENTION

The present invention relates to semiconductor processing and semiconductor devices, and more particularly, to substrate processing methods for forming dielectric materials with selected polarization by thin film vapor phase deposition.

BACKGROUND OF THE INVENTION

Dielectric materials are used for CMOS-related applications, including field-effect transistor (FET) devices and dynamic random-access memory (DRAM) devices. New methods are needed for forming dielectric materials with selected polarization by thin film vapor phase deposition.

SUMMARY OF THE INVENTION

Embodiments of the invention include methods for forming structures of dielectric films on a substrate, including high-k films that may be used as capacitors and memory cells in semiconductor devices and other devices. According to one embodiment, the method includes forming a first film of a first dielectric material on a substrate by performing a first plurality of cycles of atomic layer deposition and, thereafter, heat-treating the first film, where a thickness of the first film is below a threshold thickness needed for spontaneous polarization in the first dielectric material. The method further includes forming a second film of a second dielectric material on the substrate by performing a second plurality of cycles of atomic layer deposition and, thereafter, heat-treating the second film, where a thickness of the second film is greater than the thickness of the first film, and the second film is ferroelectric or antiferroelectric.

According to one embodiment, a semiconductor device includes a first film of a first dielectric material on a substrate, where a thickness of the first film is below a threshold thickness needed for spontaneous polarization in the first dielectric material, and a second film of a second dielectric material on the substrate, where a thickness of the second film is greater than the thickness of the first film, and the second film is ferroelectric or antiferroelectric.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
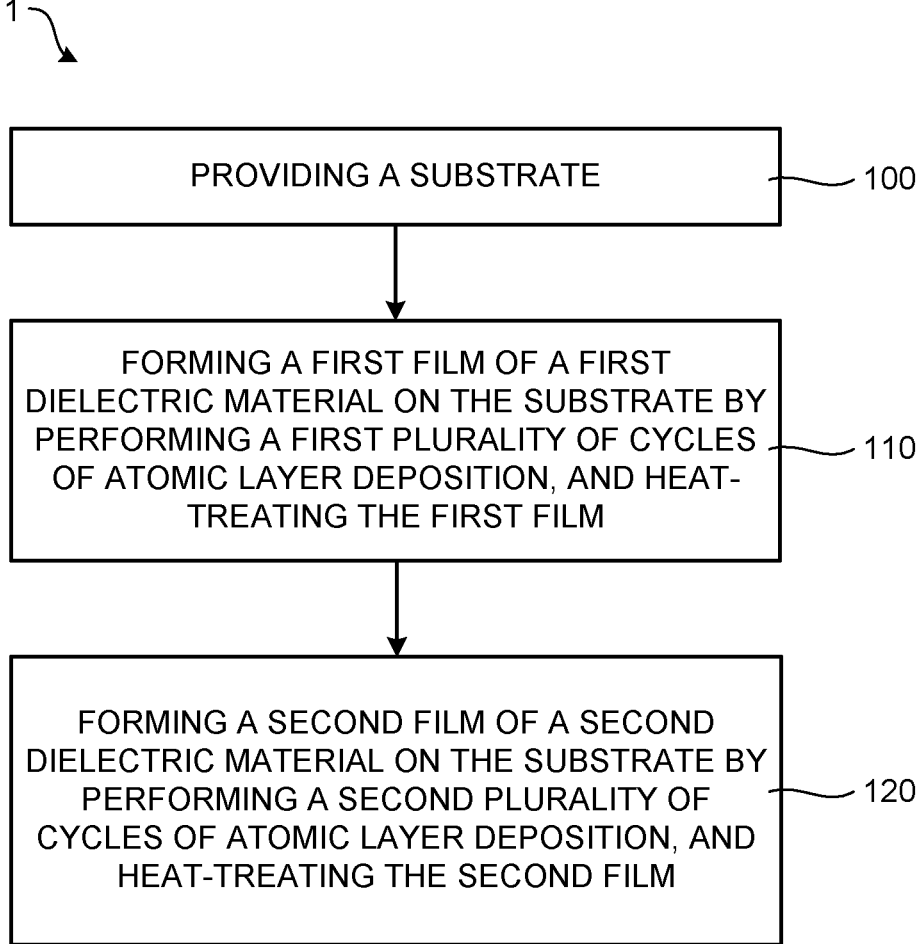
FIG. 1 is a flowchart of an example method of manufacturing a dielectric film structure according to an embodiment of the invention.

The present disclosure repeats reference numerals in the various embodiments. This repetition is for the purpose of simplicity and clarity such that repeated reference numerals indicate similar features amongst the various embodiments unless stated otherwise.

According to one embodiment, schematically shown in FIGS. 1 and 2A-2E, a method in flowchart 1 includes, in 100, providing a substrate 200 in a process chamber. In one example, the process chamber may be configured to perform atomic layer deposition (ALD) of a dielectric material on the substrate 200. The substrate 200 may, for example, include a semiconductor material, including silicon, germanium, silicon germanium, silicon germanium carbide, gallium arsenic phosphide, gallium indium phosphide, silicon carbide, gallium arsenic, indium arsenide, or indium phosphide. In one example, the substrate 200 may have an epitaxial layer overlying a bulk semiconductor. Furthermore, the substrate 200 may include a semiconductor-on-insulator (SOI) structure. Still further, the substrate 200 may include a metal layer.

The substrate 200 may also include various p-type doped regions and/or n-type doped regions, implemented by a process such as ion implantation and/or diffusion. Those doped regions can include n-well, p-well, light-doped region (LDD) and various channel doping profiles configured to form various integrated circuit (IC) devices, such as a complimentary metal-oxide-semiconductor field-effect transistor (CMOSFET), an imaging sensor, and/or a light emitting diode (LED).

The substrate 200 may also include various isolation regions. The isolation regions separate various device regions in the substrate 200. The isolation regions include different structures formed by using different processing technologies. For example, the isolation regions may include shallow trench isolation (STI) regions. The formation of an STI region may include etching a trench in the substrate 200 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

Figure 2A:
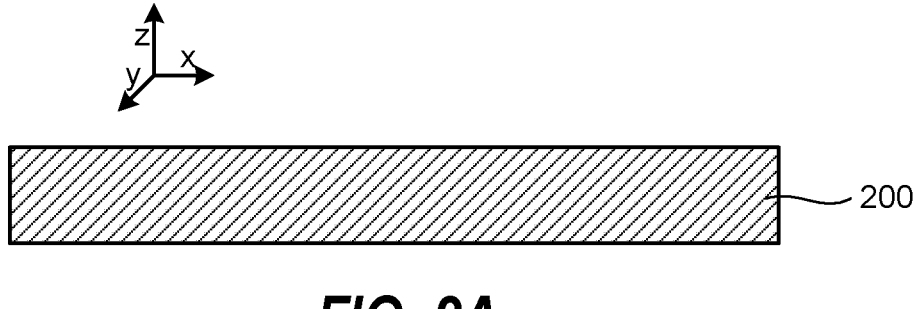
FIGS. 2A-2E show cross-sectional views of an example dielectric film structure according to an embodiment of the invention.
Figure 2B:
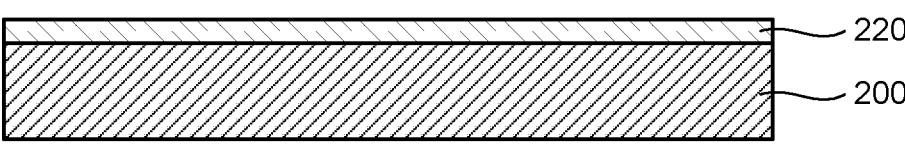

The method further includes, in 110, forming a first film 220 of a first dielectric material on the substrate 200 by performing a first plurality of cycles of atomic layer deposition (ALD). This is schematically shown in FIG. 2B. According to some embodiments, the first film 220 includes a high dielectric constant (high-k) material with a dielectric constant greater than that of $SiO_2$ (k~4). In the example of a metal oxide, the ALD can include cycles of alternating saturating gaseous exposures of a metal-containing precursor and an oxidizer, where each cycle includes one exposure of the metal-containing precursor, followed by one exposure of the oxidizer. Each cycle deposits one atomic layer or less of the metal oxide, and the number of cycles may selected in order to accurately control the film thickness. Steric hindrance of ligands in the metal-containing precursor and the oxidizer, and a limited number of bonding sites, can limit the chemisorption on the substrate surface, and therefore the film growth per cycle can remain at less than one atomic layer.

According to some embodiments, the first film 220 can contain zirconium oxide ($ZrO_2$), hafnium oxide ($HfO_2$), or laminates or mixtures thereof. The $HfO_2$ may be doped with aluminum (Al), gadolinium (Gd), lanthanium (La), silicon (Si), strontium (Sr), or yttrium (Y) dopants.

In one example, a first film 220 containing $ZrO_2$ may be deposited by ALD using cycles of alternating gaseous exposures of a zirconium-containing precursor and an oxidizer. In another example, a first film 220 containing a mixture of $ZrO_2$ and $HfO_2$ may be deposited by ALD using cycles of alternating gaseous exposures of a zirconium-containing precursor, and oxidizer, a hafnium-containing precursor, and an oxidizer. In yet another example, a first film 220 containing doped $HfO_2$ may be deposited by ALD using cycles of alternating gaseous exposures of a hafnium-containing precursor, a dopant gas, and an oxidizer. The dopant concentration can, for example, be between about 0.1 atomic % and about 20 atomic %, between about 0.1 atomic % and about 10 atomic %, or between about 0.1 atomic % and about 1 atomic %.

Embodiments of the invention may utilize a wide variety of zirconium (Zr) and hafnium (Hf) precursors for the vapor phase deposition. For example, representative examples include: $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), and $Hf(NMe2)4$ (tetrakis(dimethylamido)hafnium, TDMAH). In some examples, tris(dimethylaminocyclopentadienylhafnium ($HfCp(NMe_2)_3$) available from Air Liquide as HyALD™ may be used as a hafnium precursor and tris(dimethylaminocyclopentadienylzirconinum ($ZrCp(NMe_2)_3$) available from Air Liquide as ZyALD™ may be used as a zirconium precursor. The oxidizer may include an oxygen-containing gas, including plasma-excited $O_2$, water ($H_2O$), or ozone ($O_3$).

The Al, Gd, La, Si, Sr, and Y dopants may be provided using any dopant gases that have sufficient reactivity, thermal stability, and volatility.

Examples of Al precursors include $Al_2Me_6$, $Al_2Et_6$, [Al $(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Gd precursors include $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Examples of La precursors include $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3·CH_3$ $(OCH_2CH_2)_3OCH_3$, $La(C_{11}H_{19}O_2)_3·CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Examples of silicon precursors include silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), and alkylaminosilane compounds. Examples of alkylaminosilane compounds include, but are not limited to, di-isopropylaminosilane ($H_3Si(NPr_2)$), bis(tert-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(di-isopropylamino)silane ($H_2Si(NPr_2)_2$), tris(isopropylamino)silane ($HSi(NPr_2)_3$), and (di-i sopropylamino)silane ($H_3Si(NPr_2)$).

Examples of Sr precursors include Bis(tert-butylacetamidinato)strontium (TBAASr), Sr—C, Sr-D, $Sr(N(SiMe_3)_2)_2$, $Sr(THD)_2$, $Sr(THD)_2(tetraglyme)$, $Sr(iPr_4Cp)_2$, $Sr(iPr_3Cp)_2$, and $Sr(Me_5Cp)_2$.

Examples of Y precursors include $Y(N(SiMe_3)_2)_3$, $Y(N(iPr)_2)_3$, $((iPr)Cp)_3Y$, $Cp_3Y$, $Y(THD)_3$, $Y[OOCCH(C_2H_5)C_4H_9]_3$, $Y(O(iPr))_3$, $Y(acac)_3$, $(C_5Me_5)_2Y$, $Y(hfac)_3$, and $Y(FOD)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Figure 2C:
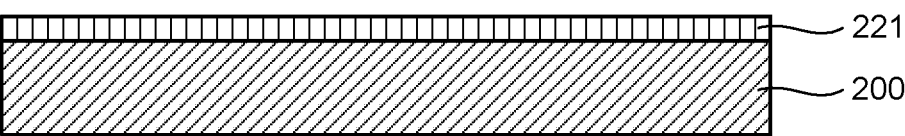

Following deposition of the first film 220 on the substrate 200, a heat-treating process is performed on the first film 220 using a predetermined substrate temperature and time period to form a heat-treated first film 221. This is schematically shown in FIG. 2C. The heat-treating organizes the atomic elements in the first film 220, reduces the film stress, and locks in the crystallographic orientation of the first dielectric material. The heat-treating for the first film 220 may be performed at a substrate temperature of about 500° C. or lower, between about 200° C. and about 500° C., between about 200° C. and about 300° C., between about 300° C. and about 400° C., or between about 400° C. and about 500° C. In one example, the heat-treating may be performed in the same process chamber as the deposition of the first film 220. In another example, the heat-treating may be formed in a different process chamber than the deposition of the first film 220. The heat-treating may be performed under vacuum conditions in the presence of an inert gas, for example argon(Ar) or nitrogen ($N_2$).

According to one embodiment of the invention, a thickness of the heat-treated first film 221 can be about 1.5 nm, or less. In the case of a first dielectric material containing a metal oxide, this thickness corresponds to only a few atomic monolayers of the metal oxide, and this thickness is below a threshold thickness needed for spontaneous polarization in the metal oxide. This results in a linearly polarizable metal oxide film in the presence of an external electric field. In one example, the heat-treated first film 221 contains textured tetragonal $ZrO_2$ with (111) crystallographic orientation.

Figure 3:
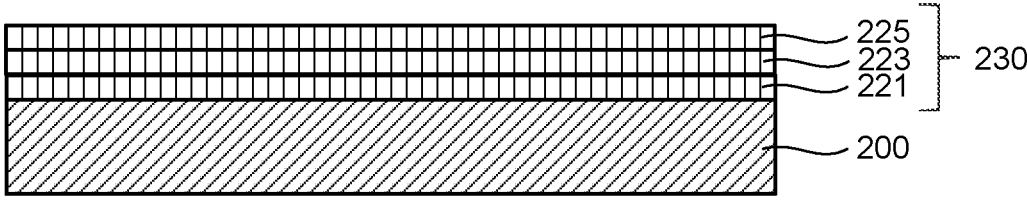
FIG. 3 shows a cross-sectional view of an example dielectric film structure according to an embodiment of the invention.

According to one embodiment, additional heat-treated films of dielectric materials may be formed on the heat-treated first film 221 by repeating the depositing and heat-treating steps at least once. This is schematically shown in FIG. 3, where additional heat-treated films 223, 225 are formed on the heat-treated first film 221 on the substrate 200 by repeating the depositing and heat-treating steps twice. In general, any number of additional heat-treated films may be formed. Collectively, the heat-treated first film 221 and the additional heat-treated films 223, 225 form a linearly polarizable dielectric material 230.

Figure 2D:
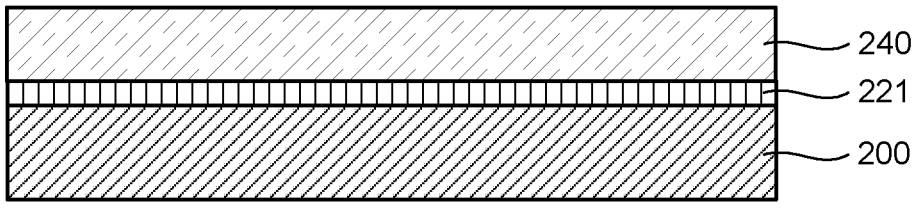

Referring back to FIG. 1, the method further includes, in 120, forming a second film 240 of a second dielectric material on the substrate 200 by performing a second plurality of cycles of ALD. This is schematically shown in FIG. 2D. According to embodiments of the invention, a thickness of the second film 240 is greater than a thickness of the heat-treated first film 221. The second film 240 can include a high-k material. According to some embodiments, the second film 240 can contain $ZrO_2$, $HfO_2$, or laminates or mixtures thereof. The $HfO_2$ may be doped with Al, Gd, La, Si, Sr, or Y dopants. In one example, the heat-treated first film 221 and the second film 240 can contain the same metal oxide.

Figure 2E:
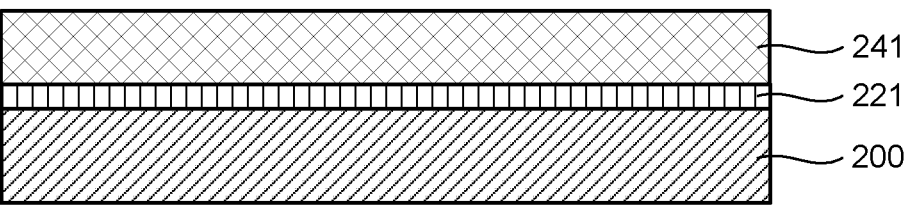

Following deposition of the second film 240, a heat-treating process is performed using a predetermined substrate temperature and time period to form a heat-treated second film 241. This is schematically shown in FIG. 2E. The heat-treating organizes the atomic elements in the second film 240, reduces the film stress, and locks in the crystallographic orientation of the second dielectric material. The heat-treated second 241 and the heat-treated first film 221 can have different crystallographic orientations.

The heat-treating of the second film 240 may be performed at a substrate temperature of about 500° C. or lower, between about 200° C. and about 500° C., between about 200° C. and about 300° C., between about 300° C. and about 400° C., or between about 400° C. and about 500° C. According to one embodiment, a cap layer (not shown) may be deposited on the second film 240 prior to the heat-treating. In one example, the cap layer can include titanium nitride (TiN).

In one example, the heat-treating of the second film 240 may be performed in the same process chamber as the deposition of the second film 240. In another example, the heat-treating may be formed in a different process chamber than the deposition of the second film 240. The heat-treating may be performed under vacuum conditions in the presence of an inert gas, for example Ar or $N_2$.

Normally, a thickness of the heat-treated second film 241 is greater than a thickness of the heat-treated first film 221, and the heat-treated second film 241 is ferroelectric or antiferroelectric. In some examples, a thickness of the heat-treated second film 241 is about 5 nm, or greater.

Figure 4:
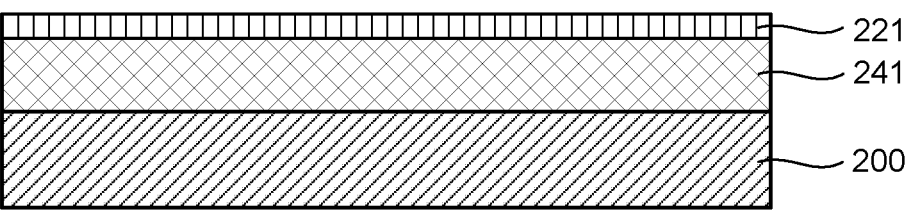
FIG. 4 shows a cross-sectional view of an example dielectric film structure according to an embodiment of the invention.

According to another embodiment of the invention, the heat-treated second film 241 is formed on the substrate 200 and, thereafter, the heat-treated first film 221 is formed on the heat-treated second film 241. This is schematically shown in FIG. 4.

Figure 5:
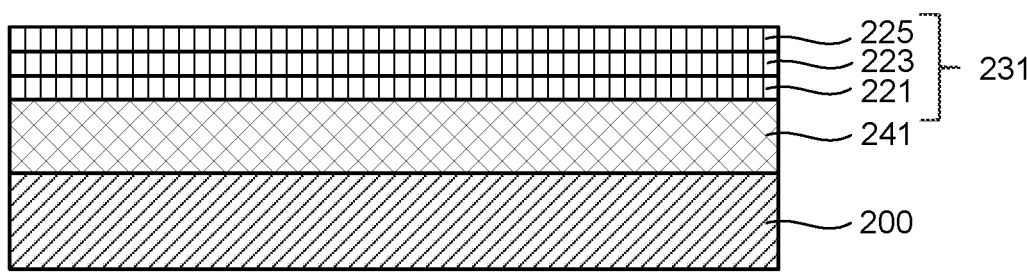
FIG. 5 shows a cross-sectional view of an example dielectric film structure according to an embodiment of the invention.

According to one embodiment, additional heat-treated dielectric material may the formed on the heat-treated first film 221 by repeating at least once the depositing and heat-treating steps. This is schematically shown in FIG. 5, where additional heat-treated films 223, 225 are formed on the heat-treated first film 221. Generally, any number of additional heat-treated film may be formed. Collectively, the heat-treated first film 221 and the additional heat-treated films 223, 225 form a linearly polarizable dielectric material 231.

Embodiments described herein provide methods for forming dielectric materials on a substrate that may be utilized for CMOS-related applications, for example for forming negative capacitance (NC) gate stacks for field-effect transistor (FET) devices or dynamic random-access memory (DRAM) devices. The dielectric materials may, for example, be formed with selected and modulated polarization for use in metal-oxide-semiconductor field-effect transistors (MOS-FETs) with very short channel length for ultra-low power computing.

Figure 6A:
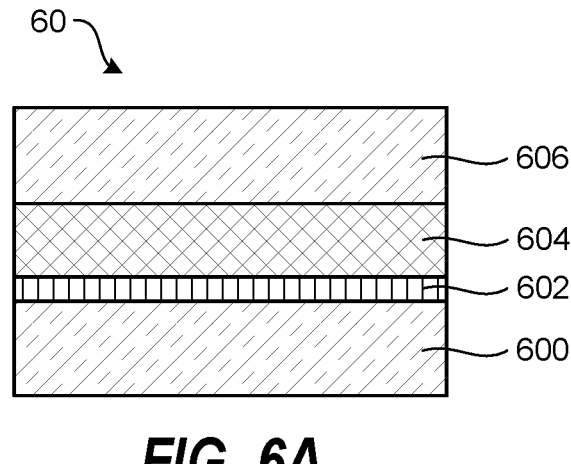
FIGS. 6A and 6B schematically show cross-sectional views of example film structures for semiconductor devices according to embodiments of the invention.

FIG. 6A schematically shows a cross-sectional view of a film structure 60 for a semiconductor device, where the film structure 60 contains a first conductive layer 600, a first film 602 containing a first dielectric material, a second film 604 containing a second dielectric material, and a second conductive layer 606 on the second film 604. The first and second conductive layers 600, 606 may include metal-containing materials, for example aluminum (Al), copper (Cu), tungsten (W), nickel (Ni), platinum (Pt), alloys thereof, or metal compounds such as titanium nitride (TiN) or tantalum nitride (TaN). The first and second conductive layers 600, 606 may also include a metal silicide or doped silicon. In one example, the first and second conductive layers 600, 606 may be selected to be compatible for n-type and p-type FETs. The first film 602 may be formed as described above for heat-treated first film 221. The first film 602 can have a thickness below a threshold thickness needed for spontaneous polarization in the first dielectric material. Thus, the first film 602 may be linearly polarizable in the presence of an external electric field. The second film 604 may be formed as described above for heat-treated second film 241. The second film 604 can have a thickness that is greater than the thickness of the first film 602, and the second dielectric material has spontaneous polarization. The spontaneous polarization can be ferroelectric or antiferroelectric. A capacitance C of the film structure 60 is composed of the capacitance of the films and layers shown in FIG. 6A.

The first film 602 can contain ZrO2, HfO2, or laminates or mixtures thereof. The $HfO_2$ may be doped with Al, Gd, La, Si, Sr, or Y dopants. Exemplary methods for forming of the first film 602 and the second film 604 are described in FIGS. 1-5.

Figure 6B:
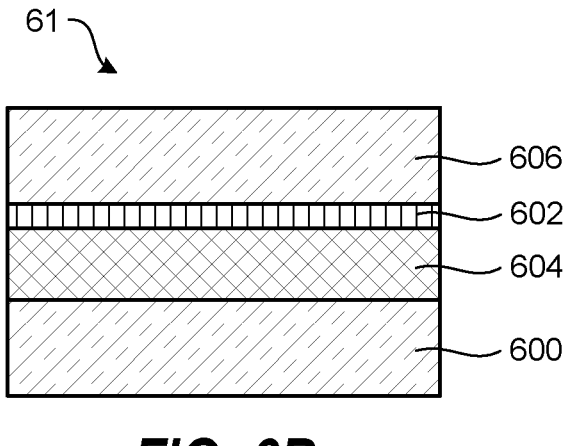

The film structure 61 in FIG. 6B is similar to the film structure 60 and contains a first conductive layer 600, a second film 604 containing a second dielectric material, a first film 602 containing a first dielectric material, and a second conductive layer 606 over the first film 602.

The film structures 60, 61 may undergo further CMOS or MOS technology processing to form various features and regions known in the art. For example, subsequent processing may form a multilayer interconnection that includes vertical interconnects, such as conventional vias or contacts, and horizontal interconnects, such as metal lines. The various interconnection features may implement various conductive materials including copper, tungsten, and/or silicide to provide electrical routings to couple various devices in the substrate to the input/output power and signals.

A plurality of embodiments for forming dielectric materials with selected polarization by thin film vapor phase deposition have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:

forming a semiconductor device containing a heat-treated first film and a heat-treated second film, the heat-treated first film having a different crystallographic orientation than the second heat-treated film, by:

a) forming a first film of a first dielectric material on a substrate by performing a first plurality of cycles of atomic layer deposition and, thereafter, heat-treating the first film to lock in the crystallographic orientation of the first dielectric material in the heat-treated first film, wherein a thickness of the first film is below a threshold thickness needed for spontaneous polarization in the first dielectric material, and the heat-treated first film in the semiconductor device is not spontaneously polarized and exhibits linear polarization in the presence of an external electric field; and b) forming a second film of a second dielectric material on the substrate by performing a second plurality of cycles of atomic layer deposition and, thereafter, heat-treating the second film to lock in the crystallographic orientation in the heat-treated second dielectric film, wherein a thickness of the second film is greater than the thickness of the first film, and the heat-treated second film in the semiconductor device is ferroelectric or antiferroelectric, and wherein a) is performed before b), or b) is performed before a).

2. The method of claim 1, wherein the second film is formed on the first film.

3. The method of claim 1, wherein the first film is formed on the second film.

4. The method of claim 1, wherein the first and second dielectric materials include at least one metal oxide.

5. The method of claim 4, wherein the at least one metal oxide includes zirconium oxide, hafnium oxide, or a laminate or a mixture thereof.

6. The method of claim 1, wherein the thickness of the first film is about 1.5 nm, or less.

7. The method of claim 1, further comprising:

repeating a) to form an additional film on the first film, wherein the additional film lacks spontaneous polarization.

8. The method of claim 1, wherein a) is performed before b), the method further comprising:

depositing a cap layer on the second film prior to heat-treating the second film.

9. The method of claim 1, wherein heat-treating the first film and heat-treating the second film are performed at a substrate temperature between about 650° C. and about 900° C. in the presence of an inert gas.

10. A substrate processing method, comprising:

forming a semiconductor device containing a heat-treated first film and a heat-treated second film, the heat-treated first film having a different crystallographic orientation than the second heat-treated film, by:

a) forming a first film of a first zirconium oxide material on a substrate by performing a first plurality of cycles of atomic layer deposition and, thereafter, heat-treating the first film to lock in the crystallographic orientation of the first dielectric material in the heat-treated first film, wherein a thickness of the first film is below a threshold thickness needed for spontaneous polarization in the first zirconium oxide material, and the heat-treated first film in the semiconductor device is not spontaneously polarized and exhibits linear polarization in the presence of an external electric field; and b) forming a second film of a second zirconium oxide material on the substrate by performing a second plurality of cycles of atomic layer deposition and, thereafter, heat-treating the second film to lock in the crystallographic orientation in the heat-treated second dielectric film, wherein a thickness of the second film is greater than the thickness of the first film, and the heat-treated second film in the semiconductor device is ferroelectric or antiferroelectric, and wherein a) is performed before b), or b) is performed before a).

* * * * *